`US008252487B2`

United States Patent
Dierichs et al.

(10) Patent No.: US 8,252,487 B2
(45) Date of Patent: Aug. 28, 2012

(54) DEVICE MANUFACTURING METHOD AND MASK FOR USE THEREIN

(75) Inventors: Marcel Mathijs Theodore Marie Dierichs, Venlo (NL); Markus Franciscus Antonius Eurlings, Tilburg (NL); Donis George Flagello, Scottsdale, AZ (US)

(73) Assignee: ASML Netherlands B.V., Veldhoven (NL)

( * ) Notice: Subject to any disclaimer, the term of this patent is extended or adjusted under 35 U.S.C. 154(b) by 1521 days.

(21) Appl. No.: 10/736,779

(22) Filed: Dec. 17, 2003

(65) Prior Publication Data

US 2005/0136334 A1 Jun. 23, 2005

(51) Int. Cl.
*G03F 1/14* (2011.01)
(52) U.S. Cl. .............................. 430/5; 430/396; 430/322
(58) Field of Classification Search .................. None
See application file for complete search history.

(56) References Cited

U.S. PATENT DOCUMENTS

| 5,523,185 A | * | 6/1996 | Goto ................................. 430/5 |
| 2003/0044721 A1 | * | 3/2003 | Hotta et al. ................... 430/311 |

FOREIGN PATENT DOCUMENTS

| JP | 61-129827 | 6/1986 |
| JP | 06-097029 A | 4/1994 |
| JP | 09-050112 | 2/1997 |
| JP | 2001-215687 | 8/2001 |

OTHER PUBLICATIONS

English Translation of Japanese Official Action issued on Nov. 5, 2008 in Japanese Application No. 2004-364656.

\* cited by examiner

*Primary Examiner* — Daborah Chacko Davis
(74) *Attorney, Agent, or Firm* — Pillsbury Winthrop Shaw Pittman LLP

(57) ABSTRACT

A device manufacturing method, is presented herein. In one embodiment, the device manufacturing method includes a mask for use with DUV having a quartz substrate and chrome absorber. The chrome absorber has a thickness of about 700 nm which causes increased TE polarization in the transmitted light and improves contrast at the substrate level.

14 Claims, 5 Drawing Sheets

DEVICE MANUFACTURING METHOD AND MASK FOR USE THEREIN

BACKGROUND OF THE INVENTION

1. Field of the Invention

The present invention relates to a device manufacturing method using a lithographic apparatus and a mask for use in the method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A conventional binary mask for use with DUV exposure radiation comprises a quartz substrate with a pattern defined thereon in a thin, normally 50 to 100 nm thick, absorber layer of chrome or chrome oxide. Although the chrome layer is essentially opaque, the contrast of the image at substrate level is not particularly high, especially at high NA values and small critical dimension. A low contrast reduces the useable process window since the dose and exposure duration must be carefully controlled to ensure the dark areas are below, and the light areas above, the resist threshold. The requirements on the resist threshold also become more strict.

SUMMARY OF THE INVENTION

Principles of the present invention, as embodied and broadly described herein, provide a device manufacturing method and a mask for use in the method by which improved contrast at substrate level can be obtained. In one embodiment, the device manufacturing method comprises providing a substrate, providing a projection beam of radiation using an illumination system, using a mask comprising a transparent substrate on which is provided a patterned absorber layer to impart the projection beam with a pattern in its cross-section, projecting the patterned beam of radiation onto a target portion of the substrate, wherein at least part of said absorber layer has a thickness substantially equal to or greater than the wavelength of said radiation of said projection beam.

Consistent with embodiments of the present invention, it has been determined that by providing a thick absorber layer contrast is improved at substrate level, especially for dense features in bright field masks, e.g. with a maximum density of 4×CD, and high NA values e.g. NA of 0.8 or greater. The invention is also particularly effective for all feature types in dark field masks. The increase of contrast is not always especially great however the costs of increasing the absorber thickness are negligible and an increase in contrast results in an increased process window which results increased yield. The improved contrast arises because the radiation transmitted by the mask with a thick absorber is more strongly polarized in TE (saggital or s-polarization) mode. TE polarized radiation interferes more at substrate level than TM (tangential plane or p-polarization). Any resultant loss of intensity is more than made up for by the improved contrast.

One possible mechanism for the increased polarization with a thick absorber is the different reflectances of the absorber to TE and TM polarization states. In a mask with a thick absorber, the radiation passing through the mask will reflect off the walls of the absorber material, possibly several times so that the lower reflectance for TM device that the proportion of TM polarization in the patterned beam is reduced.

It will be appreciated that although it may appear that the thicker the absorber layer the better, as the thickness of the absorber increases it becomes more fragile and harder to fabricate. A standard thickness absorber may be used for non-critical parts of the mask e.g. markers. A useful compromise between increasing contrast, increasing fragility and increasing difficulty of fabrication is achieved when the absorber structures have a height no greater than 3 or 4 times their width. For exposure radiation of 157 nm, 193 nm or 248 nm or thereabouts, an absorber thickness in the range of 500 to 1000 nm, preferably 600 to 800 nm, is advantageous.

In one embodiment, a preferred aspect ratio is 1:3.

A further advantage can be obtained by varying the absorber thickness for features of different types, sizes and/or densities in the mask. Since the absorber thickness affects contrast and the process window, variations of the absorber thickness can be used to overlay the process windows for features of different types in the mask so that all features print at their target size with the same exposure dose. This can also be used in combination with known OPC techniques.

According to another embodiment of the present invention, there is provided a mask for use in lithography, the mask comprising a substrate that is substantially transparent to radiation at a predetermined wavelength and a patterned absorber layer provided on the substrate, the absorber being substantially opaque to radiation at said predetermined wavelength and having a thickness equal to or greater than the predetermined wavelength.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Projection Apparatus

Figure 1:
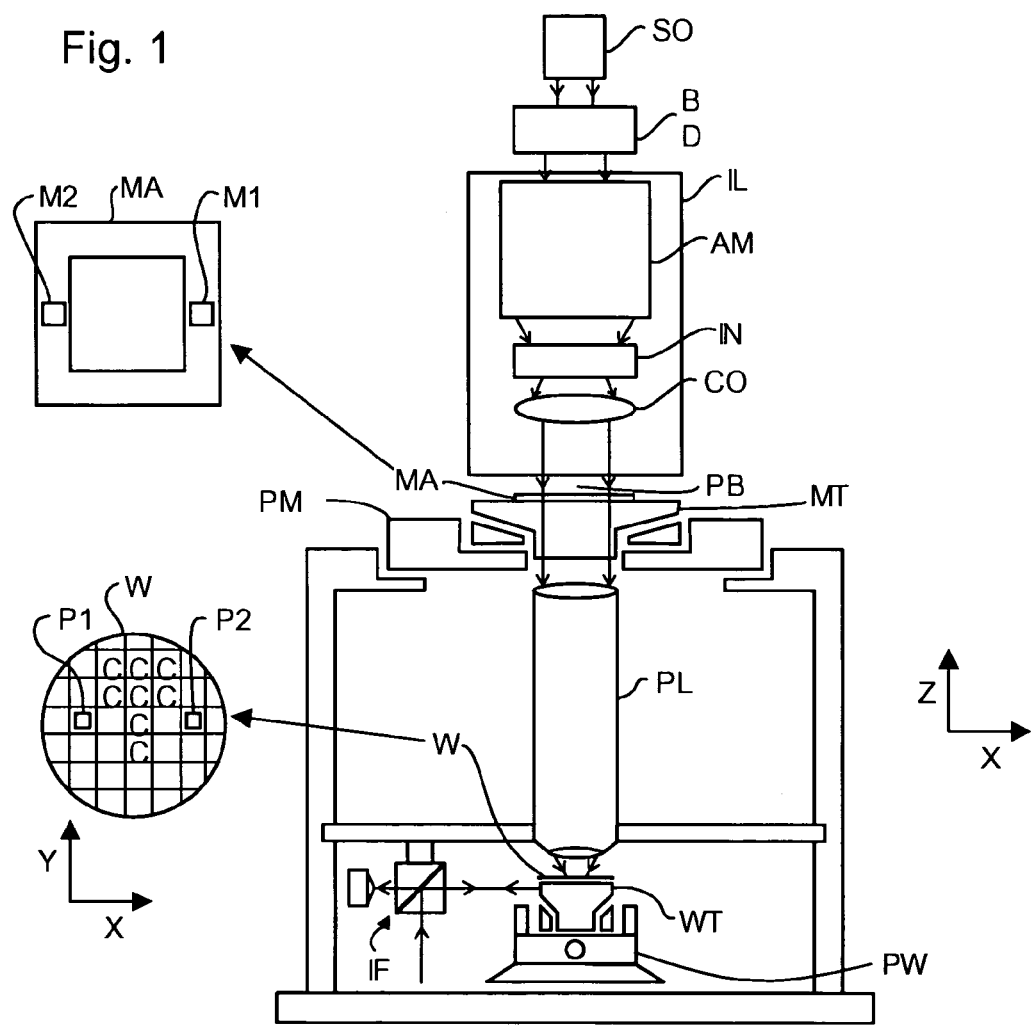
FIG. 1 depicts a lithographic apparatus which may be used to carry out the method of the invention.

FIG. 1 schematically depicts a lithographic projection apparatus according to a particular embodiment of the invention. The apparatus comprises:

an illumination system (illuminator) IL: for providing a projection beam PB of radiation (e.g. UV radiation or DUV radiation);

a first support structure (e.g. a mask table) MT: for supporting patterning device (e.g. a mask) MA and connected to first positioning device PM for accurately positioning the patterning device with respect to item PL;

a substrate table (e.g. a wafer table) WT: for holding a substrate (e.g. a resist-coated wafer) W and connected to second positioning device PW for accurately positioning the substrate with respect to item PL; and a projection system (e.g. a refractive projection lens) PL: for imaging a pattern imparted to the projection beam PB by patterning device MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

Figure 2:
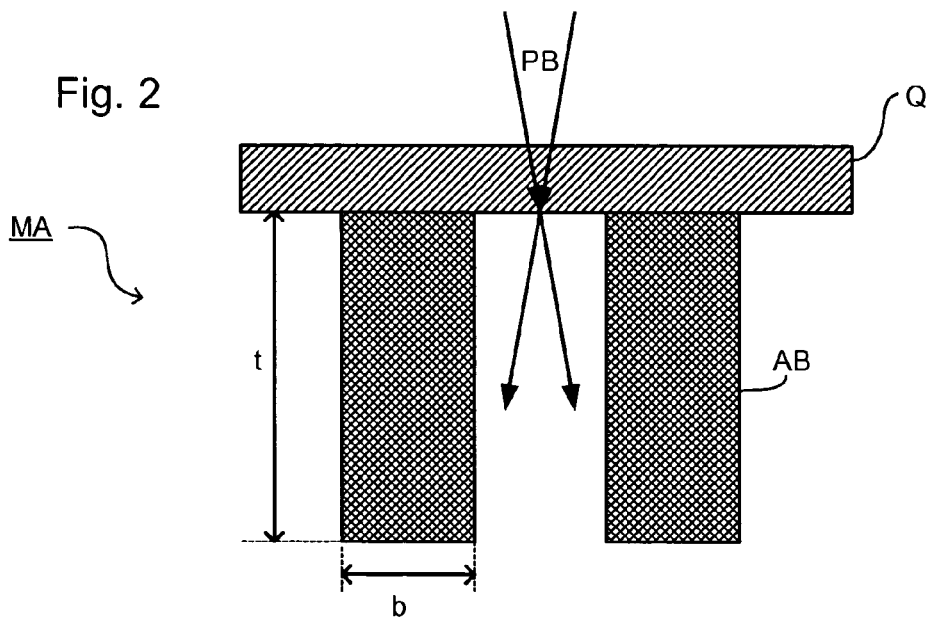
FIG. 2 depicts a part of a mask according to an embodiment of the invention in cross-section.

FIG. 2 depicts a mask (not to scale) according to an embodiment of the invention. It comprises a substrate Q, e.g. made of quartz, and a patterned absorber layer AB, e.g. of chrome or chrome oxide. The substrate and absorber layer may be conventional save that the thickness t of the absorber layer AB is substantially greater than is conventional. The thickness t should be greater than the wavelength λ of the projection beam PB and may be for example, about 700 nm for use with radiation of wavelength 193 nm.

The thickness of the absorber layer is preferably as large as possible. Practical limits on the absorber thickness may be set by manufacturing techniques and the fragility of the structures in the absorber representing device features. A useful compromise is achieved if the thickness t of the features in the absorber is no more than 3 or 4 times their width b. Thus, larger features in the absorber layer may be fabricated with greater thickness.

Figure 3:
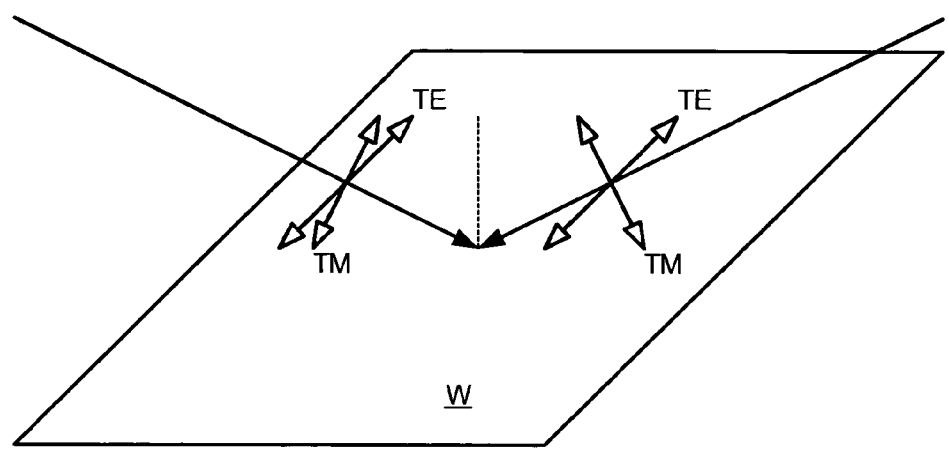
FIGS. 3 and 4 are perspective and side views illustrating polarization modes.
Figure 4:
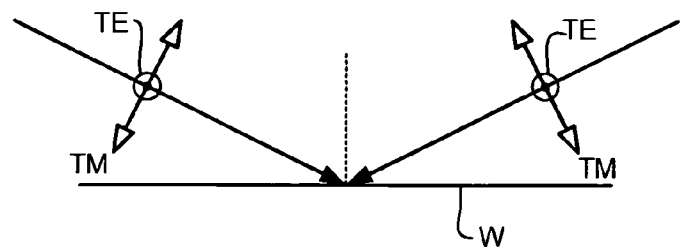

The point of the increased thickness of the absorber layer is to improve contrast in the aerial image at substrate level. Contrast improvement is achieved because with the increased absorber thickness the patterned projection beam is partially polarized in TE mode, which leads to increased interference at substrate level, especially with high NA values. This effect is illustrated in FIGS. 3 & 4 which shows that for two rays converging at the substrate with large angles of incidence (high NA) the TM polarization states are inclined to each other so interfere poorly. The TE polarization modes however remain parallel so interfere better.

Figure 5:
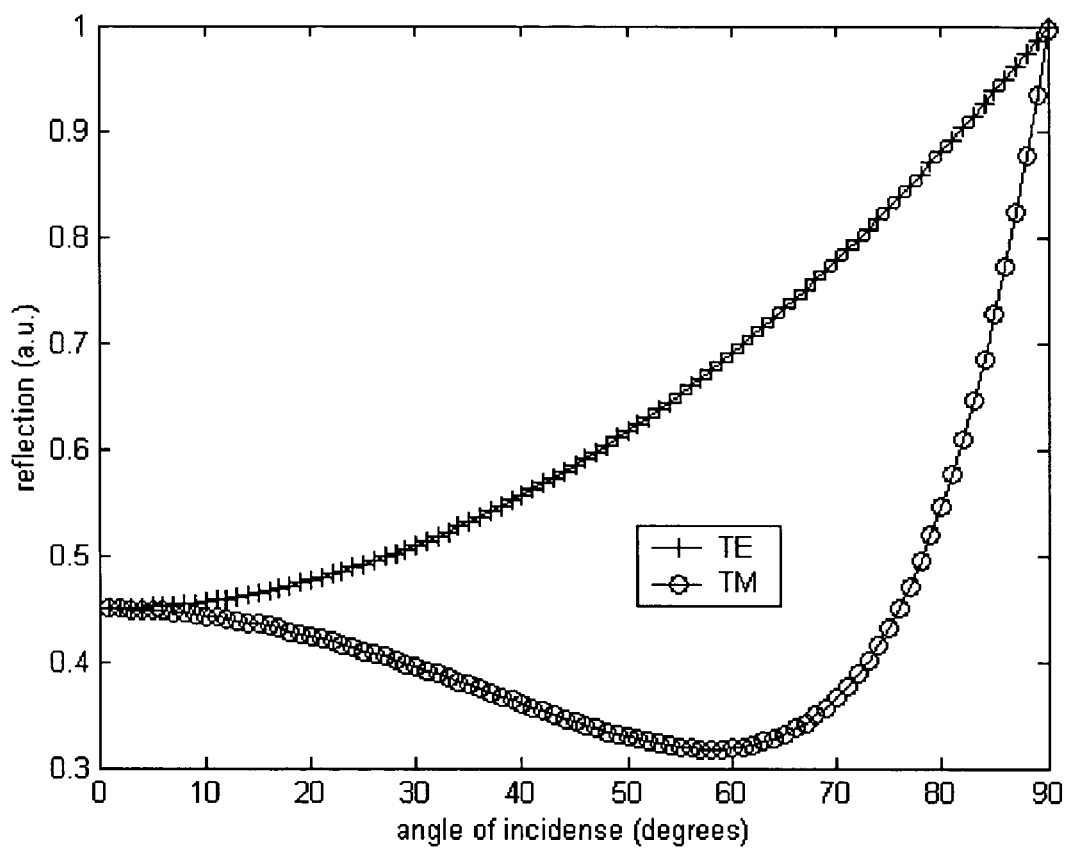
FIG. 5 is a graph of the reflectance of Cr vs. angle of incidence for TE and TM polarization modes.

The increase TE in mode polarization can perhaps be explained by the different reflectances of the absorber to TE and TM polarization modes, as shown in FIG. 5. With a relatively thick absorber AB, much of the radiation passing through the mask will make one or more grazing incidence reflections off the side walls of the absorber structures. Since the reflectance of the absorber for TE mode is greater than for TM mode at near grazing incidence, the patterned projection beam will include a higher proportion of TE mode polarization.

The effect however differs for different feature types, e.g. dense lines (pitch about 2 times CD) and isolated (pitch 8 or more times CD) or semi-isolated lines (pitch about 4 times CD) for bright field masks. The invention is also applicable to dark field masks but without the pitch variation since in a dark field mask the separation of the absorber walls is always constant.

Simulation Data

Simulations were performed using a simulator from Panasonic Technologies of a system with NA=0.93 and sigma 0.85/0.65. For exposure radiation of 193 nm two CD values were used, 60 nm and 80 nm, for exposure radiation of 248 nm only 100 nm was used. The used pitches were 2*CD (dense lines) and 4*CD (semi-isolated bright field lines). Calculated are the contrast (C=(Imax−Imin)/(Imax+Imin)) for the aerial images and the TE/TM ratio for each CD/pitch directly after the reticle, both for an absorber thickness of 100 nm and 700 nm. The results for CD=60 nm at 193 nm are shown in Table 1, the results for CD=80 nm at 193 nm are shown in Table 2, while the results for CD=100 nm at 248 nm are shown in Table 3. The 248 nm features are scaled to result in the same k1 as for CD=80 nm at 193 nm.

TABLE 1

Contrast and TE/TM intensity ratio for a CD = 60 nm line at 193 nm for 2 absorber thicknesses and 2 pitches.

| Thickness (nm) | Pitch (nm) | Contrast | TE/TM intensity |
|---|---|---|---|
| 100 | 120 | .0027 | 2.60 |
| 700 | 120 | .0062 | 58 |
| 100 | 240 | .54 | 1.4 |
| 700 | 240 | .73 | 1.56 |

TABLE 2

Contrast and TE/TM intensity ratio for a CD = 80 nm line at 193 nm for 2 absorber thicknesses and 2 pitches.

| Thickness (nm) | Pitch (nm) | Contrast | TE/TM intensity |
|---|---|---|---|
| 100 | 160 | .33 | 2.82 |
| 700 | 160 | .49 | 6.33 |
| 100 | 320 | .72 | 1.52 |
| 700 | 320 | .84 | 0.95 |

TABLE 3

Contrast and TE/TM intensity ratio for a CD = 100 nm line at 248 nm for 2 absorber thicknesses and 2 pitches.

| Thickness (nm) | Pitch (nm) | Contrast | TE/TM intensity |
|---|---|---|---|
| 100 | 200 | .29 | 2.43 |
| 700 | 200 | .44 | 4.73 |
| 100 | 400 | .68 | 1.53 |
| 700 | 400 | .84 | 1.36 |

Various conclusions can be drawn from these results. First of all, TE/TM intensity and contrast at wafer level increases for all structures if a thick absorber is used compated to the thin absorber. Secondly, contrast for the 60 nm dense lines is very low.

To understand the TE/TM transmission behavior, only the first diffraction order is considered. The diffraction angle θ for the first order can be calculated using $\sin(\theta)=\lambda/p$, with $\lambda$ the wavelength and p the pitch of the structure. Given 80 nm dense lines with p=4*160 nm (using a projection lens with a magnification of ¼) for 193 nm, the first order diffraction angle is 18 degrees. When diffraction occurs at the quartz-vacuum (or air or nitrogen etc.) interface, the first order will (partly) find the absorber in its way, where the absorber will act as a mirror. For all first orders in the space to be hitting the absorber, a 320 nm space needs an absorber thickness of around 1000 nm.

If the first order is being reflected by the absorber, it is useful to look at the reflection coefficients as a function of both polarizations. For Cr at 193 nm (n=0.84+1.65I) the results are plotted in FIG. 5. The grazing reflections for both polarizations differ considerably above 10 degrees from normal incidence. Also for the grazing angles, the reflectances of both polarizations differ significantly.

Figure 7:
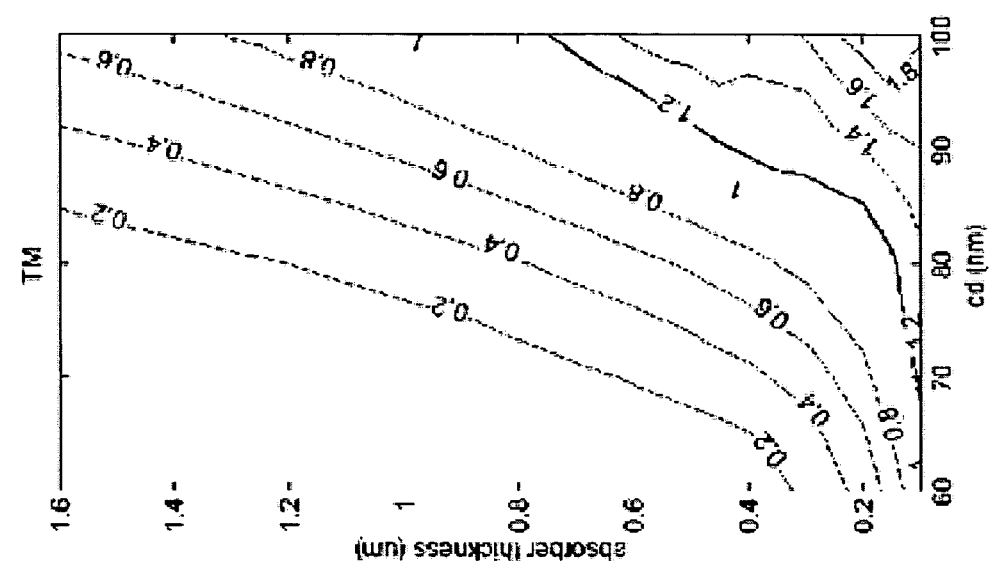
FIGS. 6 to 9 are plots showing the variation of intensity of TE mode, intensity of TM mode, total intensity and contrast with absorber thickness and critical dimension (CD).
Figure 6:
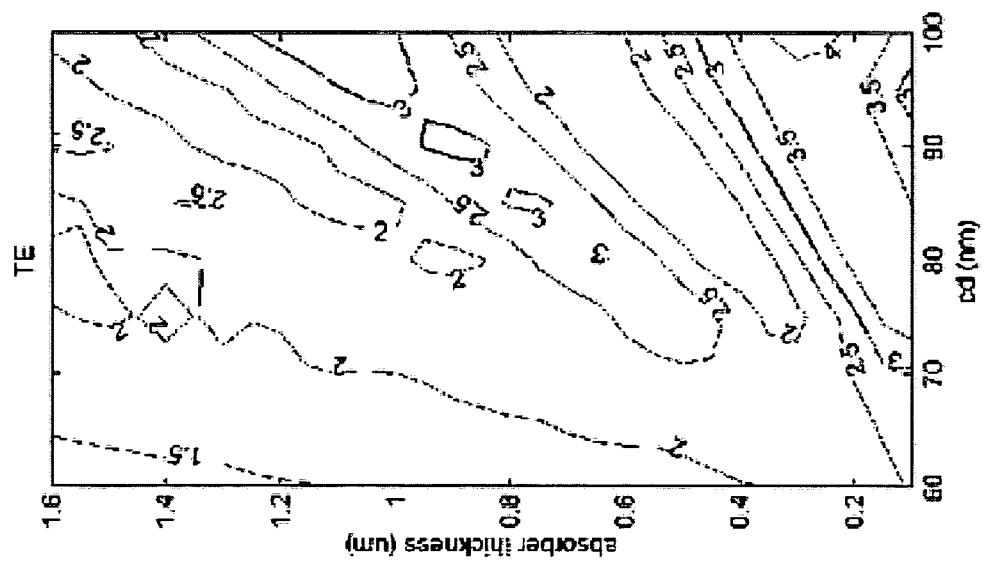

Further simulations that have been performed are the TE and TM wave intensities that leave the reticle. This was done for CD=60 to 100 nm with a step of 5 nm of dense lines, the absorber thickness ranges from 100 to 1600 nm with a step of 50 nm. These results are shown in FIGS. 6 and 7 in which contours indicate intensity values. It is clear that the TE wave intensities have an attenuated standing wave behavior, which gets even more attenuated when going to the smaller CD values. Also visible is the reduced standing wave length for the smaller CD values. Both effects can be partially understood if the reflection of the first order on the absorber is taken into account. The TM-wave intensity simply decreases for both CD and absorber.

It will be appreciated that due to the standing waves, there is an optimum thickness for maximum intensity. It also shows that the intensity at substrate level is CD dependent due to the different attenuations through the thick absorber. This enables use of the absorber thickness as an additional parameter for realizing the same dose for various CD values.

Figure 9:
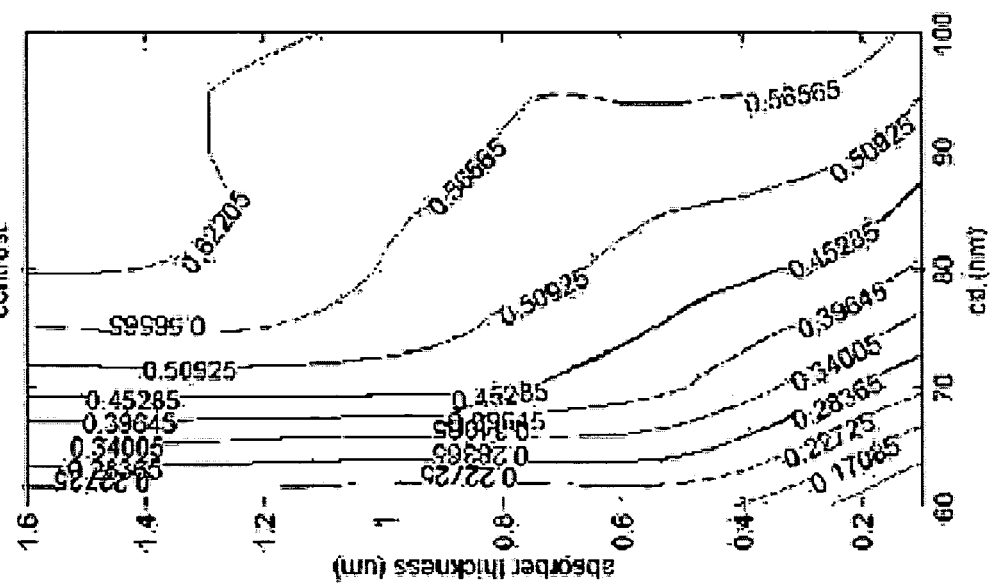
Figure 8:
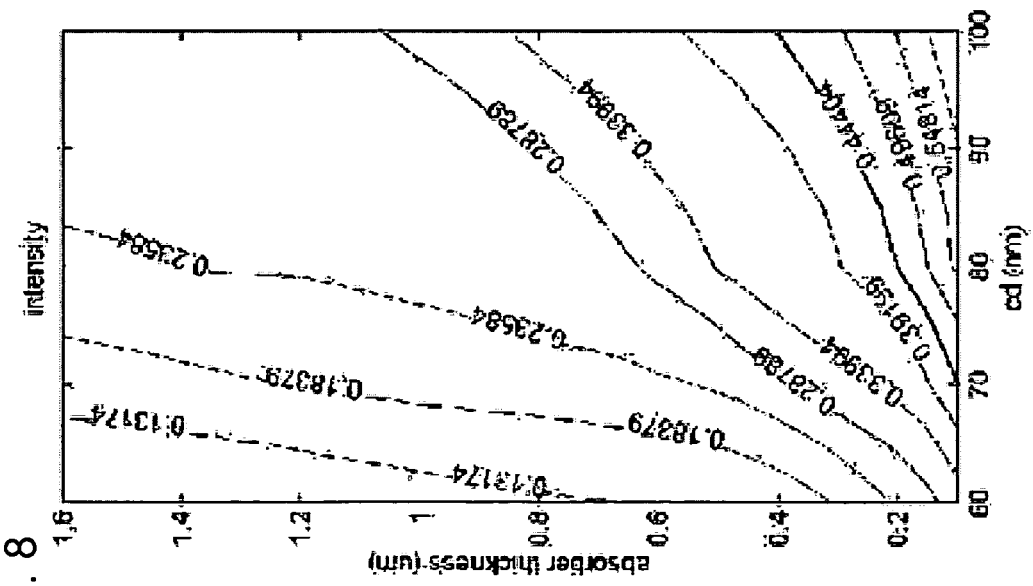

Next were considered the intensity and contrast at substrate level change as a function of both CD and absorber thickness. Using the data discussed in the previous paragraphs, the aerial images were calculated. The results of these calculations are shown in FIGS. 8 and 9, which show as contours the intensity and contrast (respectively) variation with CO and absorber thickness). A distinct increase in contrast with absorber thickness, with a tendency to plateau, can be seen.

Further simulations revealed that the exact shape of the bottom (furthest from the quartz substrate) of the absorber does not substantially affect the contrast at substrate level so that a degree of rounding of the absorber structures can be tolerated.

Whilst specific embodiments of the invention have been described above, it will be appreciated that the invention may be practiced otherwise than as described. For example, the absorber has been described as a single layer of material but multilayer absorbers may also be used.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A device manufacturing method comprising:
providing a substrate;
providing a projection beam of radiation using an illumination system;
employing a mask comprising a transparent substrate and an absorber layer having features that define a pattern in order to impart the projection beam with a pattern in its cross-section; and
projecting the patterned beam of radiation onto a target portion of the substrate,
wherein at least part of said absorber layer has a thickness substantially greater than the wavelength of said radiation of said projection beam, wherein said thickness is in the range of 500 to 1000 nm and said features of the absorber layer have a height that is greater than their width but not greater than four times their width.

2. A method according to claim 1, wherein said thickness is in the range of 600 to 800 nm.

3. A method according to claim 1, wherein said features of said pattern include:
features of a first type, and
features of a second type that differ from the features of said first type, and
wherein the thickness of the absorber layer in said features of said first type is different than the thickness of said absorber layer in said features of said second type.

4. A method according to claim 3, wherein said features of said first type differ from said features of said second type in size, shape, density, and/or pitch.

5. A method according to claim 3, wherein the difference in thickness of the absorber layer between said features of the first type and said features of the second type enables an overlay of a process window for said features of the first type with a process window for said features of the second type.

6. A device manufacturing method comprising:
providing a substrate;
providing a projection beam of radiation using an illumination system;
employing a mask comprising a transparent substrate and an absorber layer having features that define a pattern in order to impart the projection beam with a pattern in its cross-section; and
projecting the patterned beam of radiation onto a target portion of the substrate,
wherein at least part of said absorber layer has a thickness substantially greater than the wavelength of said radiation of said projection beam, wherein said thickness is in the range of from 3 to 5 times said wavelength and said features of the absorber layer have a height that is greater than their width but not greater than four times their width.

7. A mask for use in lithography, the mask comprising:
a substrate that is substantially transparent to radiation at a predetermined wavelength;
an absorber layer having features that define a pattern provided on said substrate,
wherein said absorber is substantially opaque to radiation at said predetermined wavelength and said absorber having a thickness greater than said predetermined wavelength, wherein said thickness is in the range of 500 to 1000 nm and said features of the absorber layer have a height that is greater than their width but not greater than four times their width.

8. A mask according to claim 7, wherein said thickness is in the range of 600 to 800 nm.

9. A mask according to claim 7, wherein said features further include:
features of a first type, and
features of a second type that differ from features of said first type, and
wherein the thickness of the absorber layer in said features of said first type is different than the thickness of said absorber layer in said features of said second type.

10. A mask according to claim 9, wherein said features of the first type differ from said features of the second type in size, shape, density, and/or pitch.

11. A mask according to claim 9, wherein the difference in thickness of the absorber layer between said features of the first type and said features of the second type allows for a process window for said first type of pattern features and a process window for said second type of pattern features to be brought closer together.

12. A mask for use in lithography, the mask comprising:
a substrate that is substantially transparent to radiation at a predetermined wavelength;
an absorber layer having features that define a pattern provided on said substrate,
wherein said absorber is substantially opaque to radiation at said predetermined wavelength and said absorber having a thickness greater than said predetermined wavelength, wherein said thickness is in the range of from 3 to 5 times said wavelength and said features of the absorber layer have a height that is greater than their width but not greater than four times their width.

13. A device manufacturing method comprising:
providing a substrate;
providing a projection beam of radiation using an illumination system;
employing a mask comprising a transparent substrate and an absorber layer having metallic features that define a pattern in order to impart the projection beam with a pattern in its cross-section; and
projecting the patterned beam of radiation onto a target portion of the substrate,
wherein at least part of said absorber layer has a thickness substantially greater than the wavelength of said radiation of said projection beam.

14. A method according to claim 13, wherein said metallic features of the absorber layer comprise chrome or chrome oxide.

* * * * *